United States Patent
Lingle et al.

(10) Patent No.: US 7,462,397 B2
(45) Date of Patent: Dec. 9, 2008

(54) COATED ARTICLE WITH SILICON NITRIDE INCLUSIVE LAYER ADJACENT GLASS

(75) Inventors: Philip J. Lingle, Temperance, MI (US); Scott V. Thomsen, Milford, MI (US); Anton Dietrich, Fontnas (CH); Jens-Peter Müller, Differdange (LU)

(73) Assignees: Guardian Industries Corp., Auburn Hills, MI (US); Centre Luxembourgeois de Recherches pour le Verre et la Ceramique S.A. (C.R.V.C.), Luxembourg (LU)

( * ) Notice: Subject to any disclaimer, the term of this patent is extended or adjusted under 35 U.S.C. 154(b) by 957 days.

(21) Appl. No.: 10/645,836

(22) Filed: Aug. 22, 2003

(65) Prior Publication Data

US 2004/0101694 A1 May 27, 2004

Related U.S. Application Data

(60) Continuation-in-part of application No. 10/400,080, filed on Mar. 27, 2003, now Pat. No. 6,887,575, and a continuation-in-part of application No. 10/636,918, filed on Aug. 8, 2003, now Pat. No. 7,267,879, and a continuation-in-part of application No. 10/337,383, filed on Jan. 7, 2003, now Pat. No. 6,723,211, and a continuation-in-part of application No. 10/337,384, filed on Jan. 7, 2003, now Pat. No. 6,686,050, which is a division of application No. 09/794,224, filed on Feb. 28, 2001, now Pat. No. 6,576,349.

(60) Provisional application No. 60/217,101, filed on Jul. 10, 2000.

(51) Int. Cl.
*B32B 9/00* (2006.01)

(52) U.S. Cl. ............... 428/426; 428/428; 428/432; 428/434

(58) Field of Classification Search .......... 428/428, 428/432, 426, 433, 446, 448, 697, 699, 701, 428/702, 704, 34

See application file for complete search history.

(56) References Cited

U.S. PATENT DOCUMENTS

| | | | |
|---|---|---|---|
| 3,682,528 | A | 8/1972 | Apfel et al. |
| 4,786,783 | A | 11/1988 | Woodard |
| 4,898,790 | A | 2/1990 | Finley |

(Continued)

FOREIGN PATENT DOCUMENTS

| | | |
|---|---|---|
| WO | WO 03/048060 | 6/2003 |

OTHER PUBLICATIONS

"Thermally Durable Sputter-Deposited Tin Oxide Films and Their Applications", Ebisawa et al., 4th ICCG Conf. Proceedings (2003), pp. 307-309.

(Continued)

*Primary Examiner*—Timothy M Speer
(74) *Attorney, Agent, or Firm*—Nixon & Vanderhye P.C.

(57) ABSTRACT

A low-E coated article is provided, in certain example embodiments, with a layer including silicon nitride adjacent the glass substrate in order to improve chemical and/or mechanical durability of the coated article. In certain example embodiments, the coated article may be formed so as to have a fairly high visible transmission (TY or $T_{vis}$) to sheet resistance ($R_s$) ratio (i.e., a ratio $T_{vis}/R_s$) The higher this ratio, the better the coated article's combined functionality of providing for both good solar performance (e.g., ability to reflect and/or absorb IR radiation) and high visible transmission. Coated articles herein may be used in the context of windows or the like (e.g., laminated vehicle windshields).

33 Claims, 2 Drawing Sheets

U.S. PATENT DOCUMENTS

| | | |
|---|---|---|
| 5,298,048 A | 3/1994 | Lingle et al. |
| 5,302,449 A | 4/1994 | Eby et al. |
| 5,376,455 A | 12/1994 | Hartig et al. |
| 5,425,861 A | 6/1995 | Hartig et al. |
| 5,557,462 A | 9/1996 | Hartig et al. |
| 5,563,734 A | 10/1996 | Wolfe et al. |
| 5,688,585 A | 11/1997 | Lingle et al. |
| 5,800,933 A | 9/1998 | Hartig et al. |
| 5,821,001 A | 10/1998 | Arbab et al. |
| 5,935,702 A | 8/1999 | Macquart et al. |
| 6,014,872 A | 1/2000 | Hartig et al. |
| 6,045,896 A | 4/2000 | Boire et al. |
| 6,060,178 A | 5/2000 | Krisko |
| 6,132,881 A | 10/2000 | Hartig et al. |
| 6,159,607 A | 12/2000 | Hartig et al. |
| 6,322,881 B1 | 11/2001 | Boire et al. |
| 6,355,334 B1 * | 3/2002 | Rondeau et al. ............. 428/212 |
| 6,398,925 B1 | 6/2002 | Arbab et al. |
| 6,432,545 B1 | 8/2002 | Schicht et al. |
| 6,445,503 B1 | 9/2002 | Lingle |
| 6,461,731 B1 | 10/2002 | Veerasamy et al. |
| 6,472,072 B1 * | 10/2002 | Ebisawa et al. ............. 428/432 |
| 6,475,626 B1 | 11/2002 | Stachowiak |
| 6,495,251 B1 | 12/2002 | Arbab et al. |
| 6,495,263 B2 | 12/2002 | Stachowiak |
| 6,524,688 B1 | 2/2003 | Eby et al. |
| 6,576,349 B2 | 6/2003 | Lingle et al. |
| 2001/0041252 A1 | 11/2001 | Laird |
| 2002/0031674 A1 | 3/2002 | Laird |
| 2002/0064662 A1 | 5/2002 | Lingle et al. |
| 2002/0102352 A1 * | 8/2002 | Hartig et al. ................. 427/165 |
| 2002/0192474 A1 | 12/2002 | Lingle |
| 2003/0104221 A1 | 6/2003 | Stachowiak |
| 2003/0150711 A1 * | 8/2003 | Laird .................... 204/192.11 |

OTHER PUBLICATIONS

U.S. Appl. No. 10/400,080, filed Mar. 27, 2003.
U.S. Appl. No. 10/636,918, filed Aug. 8, 2003.
U.S. Appl. No. 10/337,383, filed Jan. 7, 2003.
U.S. Appl. No. 10/337,384, filed Jan. 7, 2003.

* cited by examiner

COATED ARTICLE WITH SILICON NITRIDE INCLUSIVE LAYER ADJACENT GLASS

PRIORITY CLAIM AND CROSS-REFERENCE TO RELATED APPLICATIONS

This application is a continuation-in-part (CIP) of each of U.S. patent application Ser. No. 10/400,080, filed Mar. 27, 2003 now U.S. Pat. No. 6,887,575, Ser. No. 10/636,918, filed Aug. 8, 2003 now U. S. Pat. No. 7,267,879, Ser. No. 10/337,383, filed Jan. 7, 2003 now U.S. Pat. No. 6,723,211, and Ser. No. 10/337,384, filed Jan. 7, 2003 now U.S. Pat. No. 6,686,050 which is a division of Ser. No. 09/794,224, filed Feb. 28, 2001 (now U.S. Pat. No. 6,576,349), which claims priority on 60/217,101, filed Jul. 10, 2000, the disclosures of which are all hereby incorporated herein by reference. Priority is hereby claimed on all of the aforesaid applications.

BACKGROUND OF THE INVENTION

Windows including glass substrates with solar control coatings provided thereon are known in the art. Such windows may be used in the context of architectural windows, insulating glass (IG) window units, automotive windows such as windshields, and/or the like.

Related U.S. patent application Ser. No. 10/400,080 discloses at least a coated article having the following layer stack where the layers are listed in order from the glass substrate outwardly:

TABLE 1

(Example Materials/Thicknesses; 10/400,080)

| Layer | Thickness (Å) |
|---|---|
| $TiO_x$ | 40 Å |
| $Si_xN_y$ | 113 Å |
| $ZnO_x$ | 100 Å |
| Ag | 95 Å |
| $NiCrO_x$ | 26 Å |
| $SnO_2$ | 483 Å |
| $Si_xN_y$ | 113 Å |
| $ZnO_x$ | 100 Å |
| Ag | 131 Å |
| $NiCrO_x$ | 26 Å |
| $SnO_2$ | 100 Å |
| $Si_3N_4$ | 226 Å |

While the aforesaid coated article of Ser. No. 10/400,080 is excellent in most respects, there is room for improvement.

In particular, the aforesaid coating when used in applications such as laminated windshields may be problematic in the following areas. First, it tends to sometimes be too red/purple with respect to reflective color. It would be desirable if more neutral reflective color could be achieved. Second, durability is sometimes lacking. For example, when exposed to conventional brush testing for durability following heat treatment (HT), delamination often occurs.

It would be desirable if one or both of the aforesaid two problems could be addressed and/or solved.

Turning to another separate and distinct issue, it is known that if one wants to improve a coating's solar performance (e.g., infrared reflection), the thickness of the silver layer(s) can be increased in order to decrease the coating's sheet resistance. Thus, if one wants to improve a coating's solar performance by increasing its ability to reflect infrared (IR) rays or the like, one typically would increase the thickness of the IR reflecting silver layer(s). Unfortunately, increasing the thickness of the silver layer(s) causes visible transmission (TY or $T_{vis}$) to drop. Accordingly, in the past, when one sought to improve the solar performance of a coating in such a manner, it was at the expense of visible transmission. In other words, when solar performance was improved, visible transmission was sacrificed and decreased. Stated another way, it has been difficult to increase the ratio of visible transmission to sheet resistance (i.e., $T_{vis}/R_s$), especially if heat treatability and/or durability are to be provided. This is why many coatings that block (reflect and/or absorb) much IR radiation have a rather low visible transmission.

An excellent way to characterize a coated article's ability to both allow high visible transmission and achieve good solar performance (e.g., IR reflection and/or absorption) is the coating's $T_{vis}/R_s$ ratio. The higher the $T_{vis}/R_s$ ratio, the better the combination of the coating's ability to both provide high visible transmission and achieve good solar performance.

Certain heat treatable coatings cannot achieve very high $T_{vis}/R_s$ ratios, thereby illustrating that their combined characteristic of visible transmission relative to sheet resistance (and solar performance) may be improved. In the past, it has been theoretically possible to increase the $T_{vis}/R_s$ ratio, but not in a commercially acceptable manner. As an example, Example 2 of U.S. Pat. No. 4,786,783 could not survive heat treatment (e.g., heat bending, tempering, and/or heat strengthening) in a commercially acceptable manner. If Example 2 of the '783 patent was heat treated, the sheet resistance would effectively disappear because the silver layer(s) would heavily oxidize and be essentially destroyed, thereby leading to unacceptable optical properties such as massive (very high) haze, very large $\Delta E^*$ values, and unacceptable coloration. For example, because Example 2 of the '783 patent does not use sufficient layer(s) to protect the silver during HT, the coated article would have very high $\Delta E^*$ values (glass side reflective and transmissive) due to heat treatment; $\Delta E^*$ over 10.0 and likely approaching 20.0 or more (for a detailed discussion on the meaning of $\Delta E^*$, see U.S. Pat. Nos. 6,495,263 and/or 6,475,626, both of which are hereby incorporated herein by reference).

In view of the above, it may be desirable to improve the aforesaid coating of Ser. No. 10/400,080 or other coatings at least with respect to durability and/or reflective coloration. Moreover, in certain example instances, it may be desirable to provide a coating with good visible transmission without sacrificing solar performance and/or good solar performance without sacrificing visible transmission. With respect to this latter point, it may in certain example non-limiting situations be desirable for the $T_{vis}/R_s$ ratio to be high in a coating that may be heat treated in a commercially acceptable manner.

BRIEF SUMMARY OF EXAMPLE EMBODIMENTS OF THE INVENTION

In certain example embodiments of this invention, the titanium oxide layer adjacent the glass in the aforesaid example coated article of Ser. No. 10/400,080 is removed. Surprisingly, and unexpectedly, it has been found that removal of this titanium oxide layer allows coloration to be improved and mechanical durability to be significantly improved (note: other changes may also be made with respect to certain coatings of Ser. No. 10/400,080). With respect to color, the removal of the titanium oxide layer adjacent the glass unexpectedly allows for more neutral color to be realized. As for durability, the reason for the remarkable improvement in durability is not clear. However, it is believed that it may be related to an interfacial adhesive problem between silicon nitride and titanium oxide. Undesirable stresses at this interface can be removed by deleting the titanium oxide layer, thereby allowing durability to be significantly improved. In certain example instances, the removal of the titanium oxide layer adjacent the glass may also allow IR (infrared) blocking characteristics of the coating to improve while at the same time permitting visible transmission to increase.

Thus, it can be seen that according to certain example embodiments of this invention, removal of the titanium oxide layer adjacent the glass provides for at least one of the following advantages: (a) improved durability, (b) improved coloration, and/or (c) improved solar/optical characteristics.

In certain example embodiments of this invention, there is provided a heat treatable coated article having a visible transmission (TY, Lta or $T_{vis}$) to sheet resistance ($R_s$) ratio (i.e., a ratio $T_{vis}/R_s$) of at least 25 after heat treatment (HT), more preferably of at least 30 after HT, even more preferably of at least 32 after HT, still more preferably of at least 34 after HT, and most preferably of at least 36 after HT.

In other example embodiments of this invention, it has surprisingly and unexpectedly been found that coated articles according to certain example embodiments of this invention have improved heat treatability compared to other known coatings. For example, it has surprisingly been found that coated articles according to certain example embodiments of this invention can be exposed to about 650 degrees C. of heat treatment for 12 minutes without suffering a loss in visible transmission of more than 2%. In other words, when the coated article is exposed to about 650 degrees C. of heat treatment for 12 minutes, the coated article retains at least 98% of its pre-heat-treatment visible transmission.

In certain example embodiments of this invention, there is provided a coated article including a multi-layer coating supported by a glass substrate, the multi-layer coating comprising, from the glass substrate outwardly: a layer comprising silicon nitride located directly on and contacting the glass substrate; a layer comprising zinc oxide located directly on and contacting the layer comprising silicon nitride; a layer comprising silver located over and contacting the layer comprising zinc oxide; a dielectric layer comprising a metal oxide; another layer comprising silver; and another dielectric layer. The coated article may or may not be heat treated.

In certain other example embodiments of this invention, there is provided a heat treatable coated article including a multi-layer coating supported by a glass substrate, the multi-layer coating comprising, from the glass substrate outwardly: a layer comprising silicon nitride located directly on and contacting the glass substrate; a layer comprising at least one metal oxide; a layer comprising silver located over and contacting the layer comprising the at least one metal oxide; at least one dielectric layer; and when the coated article is exposed to about 650 degrees C. of heat treatment for 12 minutes as a reference, the coated article retains at least 98% of its pre-heat-treatment visible transmission.

DETAILED DESCRIPTION OF EXAMPLE EMBODIMENTS OF THE INVENTION

Figure 1:
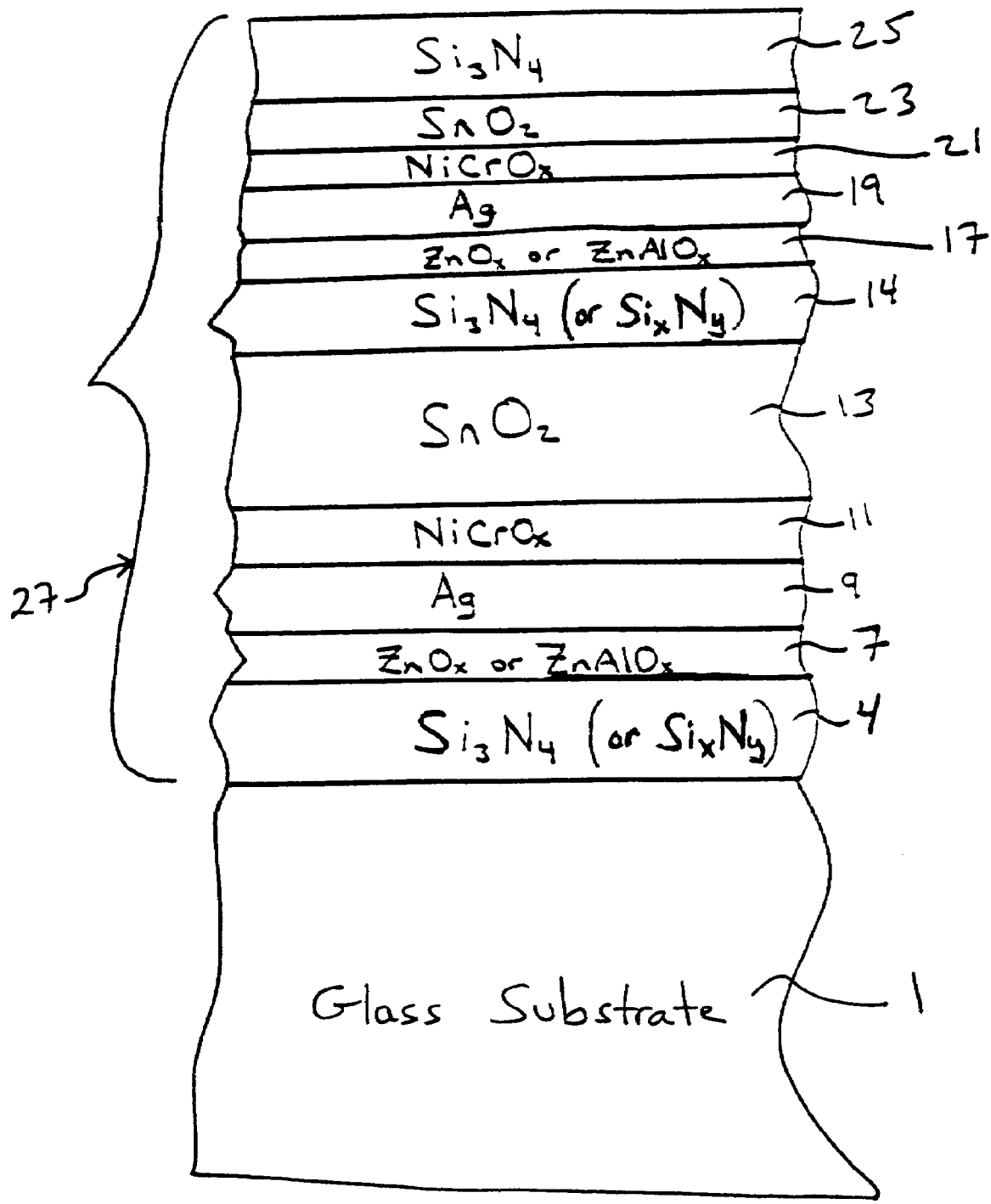
FIG. 1 is a cross sectional view of a monolithic coated article according to an example embodiment of this invention—the materials and specific layers thereof in this drawing are provided for purposes of example only.

Referring now more particularly to the accompanying drawings in which like reference numerals indicate like parts throughout the several views.

Coated articles herein may be used in applications such as vehicle windows (e.g., laminated heat treated windshields), monolithic windows, IG window units, and/or any other suitable application that includes single or multiple glass substrates.

According to certain example embodiments of this invention, the titanium oxide layer adjacent the glass in the aforesaid example coated article of Ser. No. 10/400,080 described in the background section herein is removed. Surprisingly, and unexpectedly, it has been found that removal of this titanium oxide layer allows coloration to be improved and mechanical durability to be significantly improved. With respect to color, the removal of the titanium oxide layer adjacent the glass unexpectedly allows for more neutral color (e.g., glass side reflective color) to be realized. Moreover, thermal stability upon HT may also be surprisingly improved.

While the reason for the remarkable improvement in durability is not clear, it is believed that it may be related to an interfacial adhesive problem between silicon nitride and titanium oxide in Ser. No. 10/400,800. In particular, it is believed that internal stress(es) within the titanium oxide layer and silicon nitride layer of the aforesaid coating of Ser. No. 10/400,080 become problematic, especially after heat treatment (HT). These stresses, after HT, seem to cause delamination of the coating upon exposure to conventional brush testing thereby illustrating a lack of durability. When the titanium oxide layer is removed, the silicon nitride inclusive layer is provided directly on the glass substrate and the problematic interface between the titanium oxide and silicon nitride is no longer present. Surprisingly, the removal of this apparently problematic interface (by removing the titanium oxide layer) leads to significantly improved durability, especially after HT. In certain example instances, the removal of the titanium oxide layer adjacent the glass may also allow IR (infrared) blocking characteristics of the coating to improve while at the same time permitting visible transmission to increase.

Thus, it can be seen that according to certain example embodiments of this invention removal of the titanium oxide layer adjacent the glass from the Ser. No. 10/400,080 coating provides for one or more of the following advantages: (a) improved durability, (b) improved coloration, (c) improved solar/optical characteristics, and/or (d) improved thermal stability upon HT. Coated articles may or may not be heat treated in different embodiments of this invention, although the improvement in durability is especially evident following heat treatment in certain example embodiments.

In certain example embodiments of this invention, there is provided a heat treatable coated article having a visible transmission (TY, Lta or $T_{vis}$) to sheet resistance ($R_s$) ratio (i.e., a ratio $T_{vis}/R_s$) of at least 25 after heat treatment (HT), more preferably of at least 30 after HT, even more preferably of at least 32 after HT, still more preferably of at least 34 after HF, and most preferably of at least 36 after HT. The higher this ratio, the better the coated article's combined functionality of providing for both good solar performance (e.g., ability to reflect and/or absorb IR radiation) and high visible transmission. In other words, high visible transmission can be achieved without sacrificing solar performance. In certain example embodiments, coupled with one or more of the aforesaid ratios $T_{vis}/R_s$, the coated article is heat treatable in a commercially acceptable manner in that: (i) its ΔE* value (glass side reflective and/or transmissive) due to HT is no greater than about 8.0, more preferably no greater than about 5.0, even more preferably no greater than about 4.0, even more preferably no greater than about 3.0, and sometimes no greater than 2.5; and/or (ii) the coating includes at least one metal inclusive contact layer (e.g., Ni, NiCr, Cr, Ti, TiO, $NiCrO_x$, ZnO, ZnAlO, Nb, mixtures thereof, or the like) between an IR reflecting layer (e.g., silver layer) and a dielectric layer so as to protect the IR reflecting layer during HT. Additionally, in certain example embodiments of this invention, coated articles may have a ratio $T_{vis}/R_s$, of at 20 before HT, more preferably of at least 22 before HT, even more preferably of at least 25 before HT, and most preferably of at least 28 before HT. It is noted that in certain embodiments of this invention, coated articles need not have any of the aforesaid $T_{vis}/R_s$ ratios (although they are present in many preferred embodiments). It is further noted that parameters such as $R_s$, $T_{vis}/R_s$ and ΔE* are typically measured before lamination in laminated coated article embodiments.

Factors which may contribute to the surprisingly high $T_{vis}/R_s$ ratios herein include one or more of: example layer stack portions described herein, example layer stoichiometries herein, example layer thicknesses herein, the use of a Si-rich silicon nitride inclusive layer under at least one IR reflecting layer herein, and/or the deposition of different zinc oxide inclusive layers at different oxygen partial pressures. For example, in certain example embodiments, it has surprisingly been found that the use of a combination of a Si-rich silicon nitride inclusive layer and a zinc oxide inclusive layer (e.g., ZnO, $ZnAlO_x$, or ZnO containing other element(s)) under a layer comprising silver allows the silver be deposited (e.g., via sputtering or the like) in a manner which causes its sheet resistance to be lessened compared to if other material(s) were under the silver. In certain example embodiments, a surprising finding is that the Si-rich silicon nitride inclusive $(Si_xN_y)$ layer(s) allows the ratio $T_{vis}/R_s$ to be increased significantly after HT (e.g., heat strengthening, thermal tempering, and/or heat bending). While it is not certain why this Si-rich layer $Si_xN_y$ works in such a manner, it is believed that the presence of free Si in the Si-rich silicon nitride inclusive layer may allow many atoms such as sodium (Na) which migrate outwardly from the glass during HT to be stopped by the Si-rich silicon nitride inclusive layer before they can reach the silver and damage the same. Thus, it is believed that the oxidation caused by heat treatment allows visible transmission to increase, and that the Si-rich $Si_xN_y$ layer(s) reduces the amount of damage done to the silver layer(s) during HT thereby allowing sheet resistance ($R_s$) to decrease in a desirable manner.

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and multi-layer coating (or layer system) 27 provided on the substrate 1 either directly or indirectly. The coating (or layer system) 27 may include: dielectric silicon nitride layer 4 which may be $Si_3N_4$, or a Si-rich type (which may or may not be doped with Al, stainless steel, or the like), first lower contact layer 7 which contacts and protects IR reflecting layer 9, first conductive and potentially metallic infrared (IR) reflecting layer 9, first upper contact layer 11 which contacts and protects IR reflecting layer 9, dielectric layer 13, another silicon nitride inclusive layer 14 (stoichiometric type or Si-rich type), second lower contact layer 17 which contacts and protects IR reflecting layer 19, second upper contact layer 21 which contacts and protects upper IR reflecting layer 19, dielectric layer 23, and finally protective dielectric layer 25. The "contact" layers 7, 11, 17 and 21 each contact at least one IR reflecting layer (e.g., Ag layer). The aforesaid layers 4-25 make up low-E (i.e., low-emissivity) coating 27 which is provided on glass or plastic substrate 1.

Compared to the aforesaid coated article of Ser. No. 10/400,080, it has unexpectedly been found that the removal of the titanium oxide layer adjacent the glass is advantageous for the reasons discussed above. Thus, the layer 4 comprising silicon nitride is provided directly on the glass substrate in certain example embodiments of this invention, as shown in FIG. 1. This silicon nitride layer 4 may be doped with Al, B, stainless steel, or the like in different embodiments of this invention (e.g., from 0-15%, more preferably from 1-15%, and most preferably from 5-15%). As will be explained in more detail below, the silicon nitride inclusive layer 4 may be oxidized and/or Si-rich in certain embodiments of this invention, each of which may be advantageous for certain reasons. Layer 14 may also comprise Si-rich silicon nitride in certain example embodiments.

Silicon nitride inclusive layer 4 may be oxidized in certain example embodiments of this invention so as to form silicon oxynitride. When of silicon oxynitride, layer 4 can have a variety of different indices of refraction "n"—e.g., from about 1.5 to 2.0, more preferably from 1.55 to 2.0, and most preferably at least 1.6. For laminated parts such as laminated vehicle windshields, the silicon oxynitride of layer 4 may have in certain example embodiments an index of refraction "n" of from 1.85 to 2.0, more preferably from 1.9 to 2.0 in order to avoid transmission losses due to lamination (due to the different refractive index of the material contacting the film surface such as PVB at 1.57 instead of air at 1.0, the higher index at both boundary surfaces can reduce reflection losses). Furthermore, when layer 4 is of silicon oxynitride, it may have a "k" value (550 nm) of no greater than about 0.04, more preferably no greater than about 0.03. In certain example embodiments, the "k" value is from 0.01 to 0.03, most preferably about 0.02. In certain example embodiments of this invention, silicon nitride of layer 4 may transform to silicon oxynitride during heat treatment to some extent by absorbing water residue from the glass surface from the preceding process (thus, the layer before heat treatment may be either silicon nitride or silicon oxynitride).

Moreover, in certain example embodiments, it has surprisingly been found that the use of a combination of a Si-rich silicon nitride inclusive layer (4 and/or 14) and a zinc oxide inclusive layer (e.g., ZnO or $ZnAlO_x$) (7 and/or 17) under a layer comprising silver (9 and/or 19) allows the silver to be deposited (e.g., via sputtering or the like) in a manner which causes its sheet resistance to be lessened compared to if certain other material(s) were under the silver. In certain example embodiments, a surprising finding is that the Si-rich silicon nitride inclusive $(Si_xN_y)$ layer(s) allows the ratio $T_{vis}/R_s$ to be increased significantly after HT (e.g., heat strengthening, thermal tempering, and/or heat bending). It is believed that the presence of free Si in the Si-rich silicon nitride inclusive layer(s) (4 and/or 14) may allow certain atoms such as sodium (Na) which migrate outwardly from the glass 1 during HT to be stopped by the Si-rich silicon nitride inclusive layer before they can reach the silver and damage the same.

In certain example embodiments, one or both of the potentially Si-rich silicon nitride layers 4 and/or 14 may be characterized by $Si_xN_y$ layer(s), where x/y may be from 0.76 to 1.5, more preferably from 0.8 to 1.4, still more preferably from 0.80 to 1.0 (higher x/y ratios may cause haze levels to increase undesirably). Moreover, in certain example embodiments where little or no oxygen is present in the layer(s) 4 and/or 14, before and/or after HT the Si-rich $Si_xN_y$ layer(s) (4 and/or 14), may have an index of refraction "n" of at least 2.05, more preferably of at least 2.07, even more preferably at least 2.10, and most preferably from about 2.15 to 2.25 (e.g., about 2.20) (e.g., 632 nm) (note: stoichiometric $Si_3N_4$ has an index "n" of 2.04). Also, the Si-rich $Si_xN_y$ layer(s) (4 and/or 14) in certain example embodiments may have an extinction coefficient "k" of at least 0.001, more preferably of at least 0.003 (note: stoichiometric $Si_3N_4$ has an extinction coefficient "k" of effectively 0). In certain example embodiments, the Si-rich $Si_xN_y$ layer(s) 4 and/or 14 has an extinction coefficient "k" of from about 0.01 to 0.02.

Infrared (IR) reflecting layers 9 and 19 are preferably metallic and/or conductive, and may comprise or consist essentially of silver (Ag), gold, or any other suitable IR reflecting material. These IR reflecting layers help allow coating 27 to have low-E and/or good solar control characteristics. The IR reflecting layer(s) may be slightly oxidized in certain embodiments of this invention.

The upper contact layers 11 and 21 may be of or include nickel (Ni) oxide, chromium oxide, or a nickel alloy oxide such as nickel chrome oxide ($NiCrO_x$), or other suitable material(s), in certain example embodiments of this invention. The use of, for example, $NiCrO_x$ for these layers allows durability to be improved. The $NiCrO_x$ layers may be fully oxidized in certain embodiments of this invention (i.e., fully stoichiometric), or may be at least about 50% oxidized in other embodiments of this invention. In certain preferred embodiments, the $NiCrO_x$ for/in these layer(s) may be slightly under-stoichiometric (oxygen deficient). While $NiCrO_x$ is a preferred material for these contact layers, those skilled in the art will recognize that other materials may instead be used. Contact layers 11 and/or 21 (e.g., of or including $NiCrO_x$) may or may not be oxidation graded in different embodiments of this invention. Oxidation grading means that the degree of oxidation in the layer(s) changes throughout at least part of the thickness of the layer(s) so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers 11 and 21 are set forth in U.S. Pat. No. 6,576,349, the disclosure of which is hereby incorporated herein by reference.

Lower contact layers 7 and 17 may comprise zinc oxide (e.g., ZnO) in certain example embodiments of this invention. The zinc oxide may contain Al (e.g., to form ZnAlO) or other element(s) in certain example embodiments. In certain alternative embodiments of this invention, another layer (e.g., an oxide of NiCr, an oxide of Ni, or the like) may be provided between the zinc oxide inclusive layer 7 (or 17) and the nearest IR reflecting layer 9 (or 19).

Dielectric layer 13 acts as a coupling layer between the two halves of the coating 27, and is of or includes tin oxide in certain embodiments of this invention. However, other dielectric materials may instead be used for layer 13.

Dielectric layers 23 and 25 may allow the environmental resistance of the coating 27 to be improved, and are also provided for color purposes. In certain example embodiments, dielectric layer 23 may be of or include tin oxide (e.g., $SnO_2$), although other materials may instead be used. Dielectric overcoat layer 25 may be of or include silicon nitride (e.g., $Si_3N_4$) in certain embodiments of this invention, although other materials may instead be used such as titanium dioxide, silicon oxynitride, tin oxide, zinc oxide, niobium oxide, or the like such as dielectrics with an index of refraction "n" from 1.6 to 3.0. Layer 23 (and/or other layers in FIG. 1) may be omitted in certain example embodiments of this invention.

Other layer(s) may also be provided. Moreover, certain layers of coating 27 may be removed in certain embodiments, while others may be added between the various layers or the various layer(s) may be split with other layer(s) added between the split sections in other embodiments of this invention without departing from the overall spirit of certain embodiments of this invention.

Figure 2:
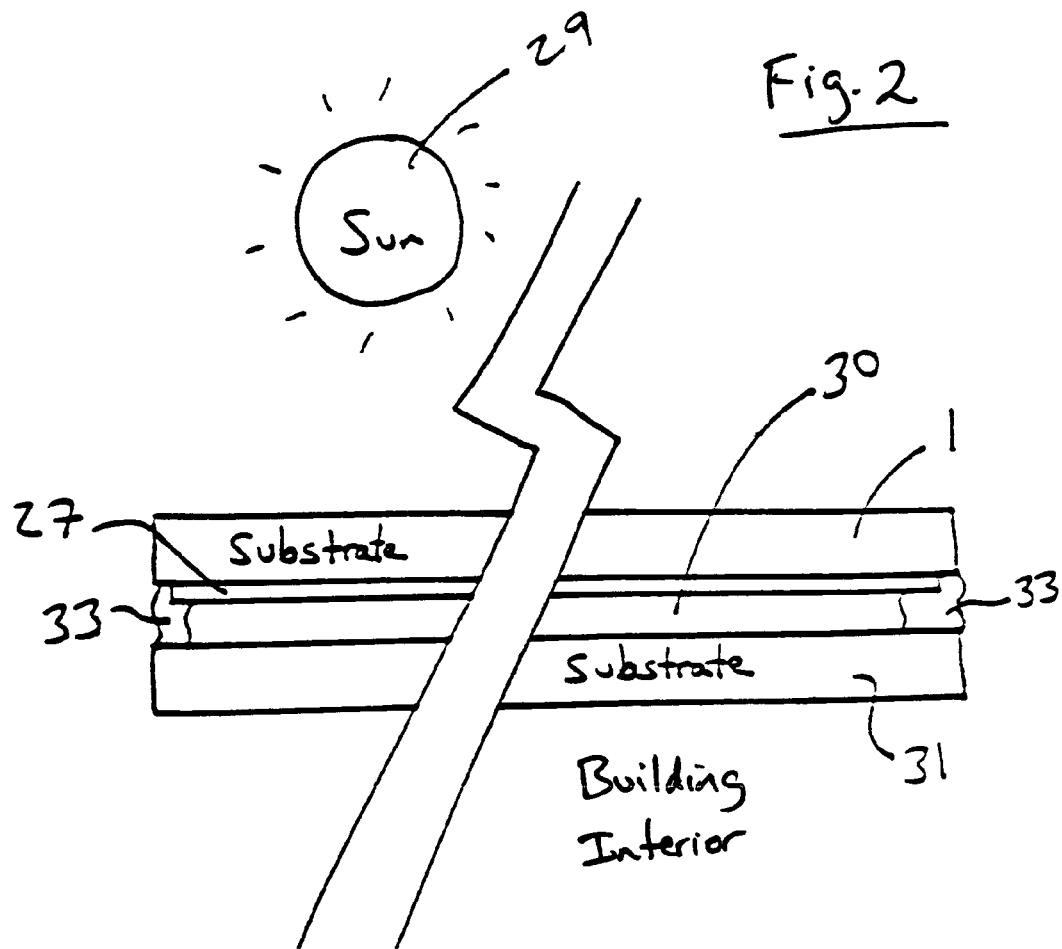
FIG. 2 is a cross sectional view of the coated article of FIG. 1 being used in an IG window unit according to an example embodiment of this invention.

FIG. 2 illustrates the coating or layer system 27 being utilized on surface #2 of an IG window unit. Coatings 27 according to any embodiment herein may be used in IG units as shown in FIG. 2. In order to differentiate the "inside" of the IG unit from its "outside", the sun 29 is schematically presented on the outside. The IG unit includes outside glass pane or sheet (i.e., substrate 1 from FIG. 1) and inside glass pane or sheet 31. These two glass substrates (e.g. float glass 1-10 mm thick) are sealed at their peripheral edges by a conventional sealant and/or spacer(s) 33 and may be provided with a conventional desiccant strip (not shown). The panes may then be retained in a conventional window or door retaining frame. By sealing the peripheral edges of the glass sheets and optionally replacing the air in insulating space (or chamber) 30 with a gas such as argon, a typical, high insulating value IG unit is formed. Optionally, insulating space 30 may be at a pressure less than atmospheric pressure in certain alternative embodiments (with or without a gas in space 30), although this of course is not necessary in all embodiments. While the inner side of substrate 1 is provided with coating 27 in FIG. 2, this invention is not so limited (e.g., coating 27 may instead be provided on the interior surface of substrate 31 in other embodiments of this invention).

Figure 3:
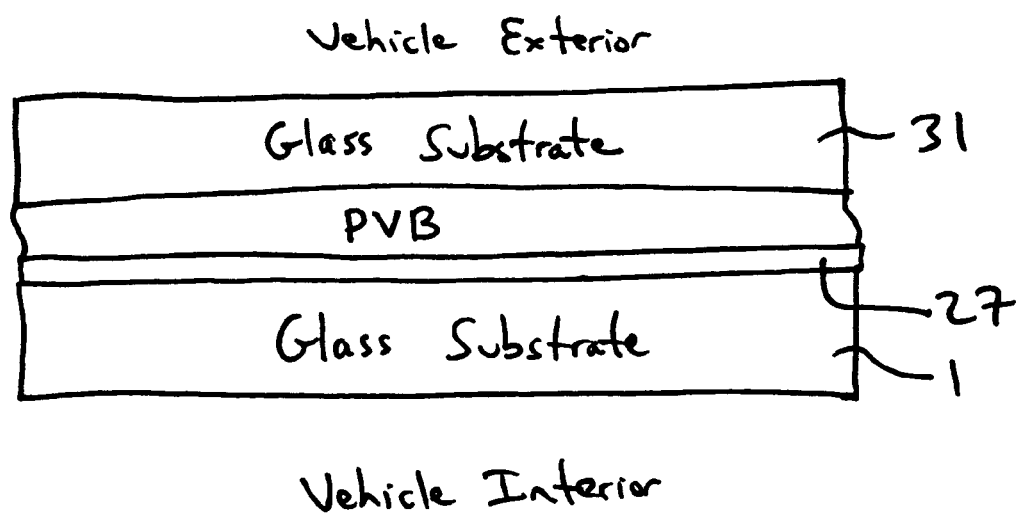
FIG. 3 is a cross sectional view of the coated article of FIG. 1 being used in a laminated vehicle windshield according to an example embodiment of this invention.

FIG. 3 illustrates the coating of FIG. 1 being used in the context of a laminated window such as a vehicle windshield including heat treated and bent glass substrates 1 and 31. In FIG. 3, the coating 27 is provided on the #3 surface, although this invention is not so limited. In other instances, the coating may be provided on the interior surface of the other substrate.

Turning back to FIG. 1, while various thicknesses may be used in different embodiments of this invention, example thicknesses and materials for the respective layers on the glass substrate I in the FIG. 1 embodiment are as follows, from the glass substrate outwardly:

TABLE 2

(Example Materials/Thicknesses; FIG. 1 Embodiment)

| Layer | Preferred Range (Å) | More Preferred (Å) | Example (Å) |
|---|---|---|---|
| $Si_xN_y$ (layer 4) | 50-450 Å | 100-200 Å | 140 Å |
| $ZnO_x$ (layer 7) | 10-300 Å | 40-150 Å | 100 Å |
| Ag (layer 9) | 50-250 Å | 80-120 Å | 95 Å |
| $NiCrO_x$ (layer 11) | 10-100 Å | 20-50 Å | 37 Å |
| $SnO_2$ (layer 13) | 0-1,000 Å | 350-800 Å | 550 Å |
| $Si_xN_y$ (layer 14) | 50-450 Å | 90-200 Å | 115 Å |
| $ZnO_x$ (layer 17) | 10-300 Å | 40-150 Å | 100 Å |
| Ag (layer 19) | 50-250 Å | 80-220 Å | 95 Å |
| $NiCrO_x$ (layer 21) | 10-100 Å | 20-50 Å | 37 Å |
| $SnO_2$ (layer 23) | 0-750 Å | 70-200 Å | 105 Å |
| $Si_3N_4$ (layer 25) | 0-750 Å | 120-320 Å | 185 Å |

In certain example embodiments of this invention, the total thickness of the combination of layers 4 and 7 is less than the total thickness of the combination of each of: (a) layers 13-17, and (b) layers 23-25. In certain example embodiments, the total thickness of the combination of layers 4 and 7 is no more that about 90% as thick as the combination of layers 23-25, more preferably no more than about 80% as thick. In certain example embodiments, the total thickness of the combination of layers 4 and 7 is no more that about 50% as thick the combination of layers 13-17, more preferably no more than about 40% as thick, and most preferably no more than about 33% as thick.

In certain example embodiments of this invention, coated articles herein may have the following low-E (low emissivity) characteristics set forth in Table 3 when measured monolithically (before any optional HT). The sheet resistances ($R_s$) herein take into account all IR reflecting layers (e.g., silver layers 9, 19) in the coating, unless expressly stated to the contrary.

TABLE 3

Low-E/Solar Characteristics (Monolithic; pre-HT)

| Characteristic | General | More Preferred | Most Preferred |
| --- | --- | --- | --- |
| $R_s$ (ohms/sq.): | <=5.0 | <=3.5 | <=3.0 |
| $E_n$: | <=0.07 | <=0.04 | <=0.03 |
| $T_{vis}/R_s$: | >=20 | >=22 | >=25 |

In certain example embodiments, coated articles herein may have the following characteristics, measured monolithically for example, after HT:

TABLE 4

Low-E/Solar Characteristics (Monolithic; post-HT)

| Characteristic | General | More Preferred | Most Preferred |
| --- | --- | --- | --- |
| $R_s$ (ohms/sq.): | <=4.5 | <=3.0 | <=2.5 |
| $E_n$: | <=0.07 | <=0.04 | <=0.03 |
| $T_{vis}/R_s$: | >=25 | >=30 | >=32 (or >=34 or 36) |

As explained above, the rather high values of the ratio $T_{vis}/R_s$, in Tables 3 and 4 are indicative of an excellent combination of high visible transmission and good solar performance (e.g., IR reflection).

Moreover, coated articles including coatings 27 according to certain example embodiments of this invention have the following optical characteristics (e.g., when the coating(s) is provided on a clear soda lime silica glass substrate 1 from 1 to 10 mm thick) (HT or non-HT). In Table 5, all parameters are measured monolithically, unless stated to the contrary. In Table 5 below, $R_g Y$ is visible reflection from the glass (g) side of the monolithic article, while $R_f Y$ is visible reflection from the side of the monolithic article on which coating/film (f) (i.e., coating 27) is located. It is noted that the ΔE* values are of course due to HT (e.g., heat strengthening, tempering, and/or heat bending). All Ill. D65 parameters are at 10 degrees.

TABLE 5

Optical Characteristics (Mono-HT)

| Characteristic | General | More Preferred |
| --- | --- | --- |
| $T_{vis}$ (or TY) (Ill. D65): | >=70% | >=75% |
| $a^*_t$ (Ill. D65): | −4.0 to +1.0 | −3.0 to 0.0 |
| $b^*_t$ (Ill. D65): | −3.0 to +4.0 | −1.0 to 3.0 |
| $L^*_t$ (Ill. D65): | 85 to 95 | 88 to 93 |
| $R_g Y$ (Ill. D65): | 1 to 10% | 3 to 9% |
| $a^*_g$ (Ill. D65): | −4.5 to +2.0 | −3.0 to 0.0 |
| $b^*_g$ (Ill. D65): | −5.0 to +10.0 | −4.0 to +8.0 |
| $L^*_g$ (Ill. D65): | 25 to 40 | 28 to 34 |
| $R_f Y$ (Ill. D65): | 1 to 10% | 1 to 8% |
| $a^*_f$ (Ill. D65): | −14.0 to 10.0 | −11.0 to 3.0 |

TABLE 5-continued

Optical Characteristics (Mono-HT)

| Characteristic | General | More Preferred |
| --- | --- | --- |
| $b^*_f$ (Ill. D65): | −9.0 to 20.0 | −7.0 to 12.0 |
| $L^*_f$ (Ill. D65): | 25 to 35 | 28 to 32 |
| ΔE*$_t$ (transmissive): | <=8.0 | <=5.0, 4.0, 3.0 or 2.5 |
| ΔE*$_g$ (glass side reflective): | <=8.0 | <=5.0, 4.0, 3.0 or 2.5 |
| Transmissive Haze: | <=0.4 | <=0.35, or <=0.25 |
| $R_s$ (ohms/square): | <=5.0 | <=3.0, or <=2.5 |

However, it is noted that in other example embodiments, the visible transmission may be lower (e.g., as low as 60%, or even 40-50% in certain instances).

The value(s) ΔE* is important in determining whether or not there is matchability, or substantial color matchability upon HT, in the context of certain embodiments of this invention. Color herein is described by reference to the conventional a*, b* values. The term Δa* is simply indicative of how much color value a* changes due to HT (the same applies to Δb*). If color changes too much upon HT (e.g., if ΔE* is over 10), then the product may not be commercially acceptable. A very high value of ΔE* may also be indicated of destruction of the Ag layer during HT, and/or of massive haze.

The term ΔE* (and ΔE) is well understood in the art and is reported, along with various techniques for determining it, in ASTM 2244-93 as well as being reported in Hunter et. al., *The Measurement of Appearance*, $2^{nd}$ Ed. Cptr. 9, page 162 et seq. (John Wiley & Sons, 1987). As used in the art, ΔE* (and ΔE) is a way of adequately expressing the change (or lack thereof) in reflectance and/or transmittance (and thus color appearance, as well) in an article after or due to HT. ΔE may be calculated by the "ab" technique, or by the Hunter technique (designated by employing a subscript "H"). ΔE corresponds to the Hunter Lab L, a, b scale (or $L_h$, $a_h$, $b_h$). Similarly, ΔE* corresponds to the CIE LAB Scale L*, a*, b*. Both are deemed useful, and equivalent for the purposes of this invention. For example, as reported in Hunter et. al. referenced above, the rectangular coordinate/scale technique (CIE LAB 1976) known as the L*, a*, b* scale may be used, wherein:

L* is (CIE 1976) lightness units
a* is (CIE 1976) red-green units
b* is (CIE 1976) yellow-blue units
and the distance ΔE* between $L^*_o a^*_o b^*_o$ and $L^*_1 a^*_1 b^*_1$ is:

$$\Delta E^* = \{(\Delta L^*)^2 + (\Delta a^*)^2 + (\Delta b^*)^2\}^{1/2} \quad (1)$$

where:

$$\Delta L^* = L^*_1 - L^*_o \quad (2)$$

$$\Delta a^* = a^*_1 - a^*_o \quad (3)$$

$$\Delta b^* = b^*_1 - b^*_o \quad (4)$$

where the subscript "o" represents the coating (or coated article) before heat treatment and the subscript "1" represents the coating (coated article) after heat treatment; and the numbers employed (e.g., a*, b*, L*) are those calculated by the aforesaid (CIE LAB 1976) L*, a*, b* coordinate technique. In a similar manner, ΔE may be calculated using equation (1) by replacing a*, b*, L* with Hunter Lab values $a_h$, $b_h$, $L_h$. Also within the scope of this invention and the quantification of ΔE* are the equivalent numbers if converted to those calculated by any other technique employing the same concept of ΔE* as defined above.

As explained above, coated articles according to certain example embodiments of this invention may have a ΔE* value (glass side reflective and/or transmissive) due to HT which is no greater than about 8.0, more preferably no greater than about 5.0, even more preferably no greater than about 4.0, even more preferably no greater than about 3.0, and sometimes no greater than about 2.5. These values are indicative of commercially acceptable heat treatable coated articles. In laminated embodiments herein, the ΔE* value is typically measured before lamination.

Moreover, coated articles including coatings 27 according to certain example embodiments of this invention have the following characteristics (e.g., when the coating(s) is provided on surface #3 (or other suitable surface) of a heat treated laminated vehicle windshield as shown in FIG. 3). In certain examples, the glass substrates in this respect may be clear glass substrates about 2.1 mm thick and the PVB interlayer may be about 0.76 mm thick. Again, all Ill. D65 measurements were at 10 degrees. Here, since the coating is on surface #3 as shown in FIG. 3, the glass side measurements would be taken from the side of the laminate which would be the interior of the vehicle.

TABLE 6

Characteristics (Laminated Windshield - HT)

| Characteristic | General | More Preferred |
|---|---|---|
| Lta (Ill. A, 2 deg.): | >= 70% | >= 75% |
| $T_{vis}$ (or TY) (Ill. D65): | >= 70% | >= 75% |
| $a^*_t$ (Ill. D65): | −5.0 to +1.0 | −3.5 to 0.0 |
| $b^*_t$ (Ill. D65): | −3.0 to +5.0 | −1.0 to 3.5 |
| $L^*_t$ (Ill. D65): | 85 to 95 | 88 to 93 |
| $R_g Y$ (Ill. D65): | 1 to 11% | 3 to 9% |
| $a^*_g$ (Ill. D65): | −4.5 to +2.0 | −3.0 to 0.0 |
| $b^*_g$ (Ill. D65): | −12.0 to +10.0 | −10.0 to +8.0 |
| $L^*_g$ (Ill. D65): | 30 to 40 | 34 to 37 |
| $R_f Y$ (Ill.D65): | 1 to 11% | 1 to 10% |
| $a^*_f$ (Ill. D65): | −10.0 to 5.0 | −5.0 to 3.0 |
| $b^*_f$ (Ill. D65): | −10.0 to 20.0 | −8.0 to 12.0 |
| $L^*_f$ (Ill. D65): | 30 to 40 | 34 to 37 |
| Transmissive Haze: | <=0.4 | <=0.35, or <=0.33 |
| $R_{solar}$ (ISO 9050): | >=25 | >=29 |
| $T_{solar}$ (TS): | <=47 | <=45 |

EXAMPLE 1

The following Example 1 is provided for purposes of example only, and is not intended to be limiting. The following examples included the listed layer stack set forth below, from the clear glass substrate outwardly.

TABLE 7

Layer Stack for Examples

| Layer | Thickness |
|---|---|
| Glass Substrate | about 2 to 2.3 mm |
| $Si_x N_y$ | 140 Å |
| $ZnAlO_x$ | 100 Å |
| Ag | 95 Å |
| $NiCrO_x$ | 37 Å |
| $SnO_2$ | 550 Å |
| $Si_x N_y$ | 115 Å |
| $ZnAlO_x$ | 100 Å |
| Ag | 95 Å |
| $NiCrO_x$ | 37 Å |
| $SnO_2$ | 105 Å |
| $Si_3 N_4$ | 185 Å |

Moreover, as explained herein, the bottom two silicon nitride layers ($Si_x N_y$) (which are doped with Al in this Example) are preferably non-stoichiometric and Si-rich. As explained above, it has been found that the use of a combination of a Si-rich silicon nitride inclusive layer and a zinc oxide inclusive layer (e.g., $ZnAlO_x$) under a layer comprising silver allows the silver to be deposited in a manner which causes its sheet resistance to be lessened (which is desirable) compared to if other material(s) were under the silver. In certain example embodiments, the Si-rich silicon nitride inclusive ($Si_x N_y$) layer(s) allows the ratio $T_{vis}/R_s$ to be increased significantly after HT.

The sputtering process used in forming the coated article of Example 1 is set forth below, with a line speed of 5.0 m/min in a Terra-G flat glass coater. Below, Ar, O and N refer to respective gas flows of these gases in the coater in units of sccm. Pressure is in units of hPa. Volts refers to volts at the cathode. The silver and NiCr targets were planar targets, the Sn targets were Twin-Mags, the ZnAl targets were twin-PLs, and the SiAl targets were DCMs. Power is indicative of the power set point. For cathodes K11 and K12, the ratio of reactive gas flow to power was about 4.43 ml/kW. Moreover, λ settings for the coater were as follows: K15-174; K28-184; and K29-181.

TABLE 8

Sputter Processing-Example 1

| Cathode | Target | Power (kW) | Ar | O | N | Pressure | Volts |
|---|---|---|---|---|---|---|---|
| K11 | SiAl | 50 | 350 | 0 | ≈300+ | 2.71E-03 | 242.5 |
| K12 | SiAl | 50 | 350 | 0 | ≈300+ | 1.75E-03 | 251.8 |
| K15 | ZnAl | 51.3 | 250 | 525 | 0 | 1.99E-03 | 279.9 |
| K21 | Ag | 8.0 | 150 | 0 | 0 | 1.27E-03 | 388.6 |
| K25 | NiCr | 18.3 | 250 | 150 | 0 | 1.44E-03 | 510.1 |
| K28 | Sn | 29.6 | 250 | 491 | 350 | 2.23E-03 | 260.7 |
| K29 | Sn | 31.2 | 250 | 501 | 350 | 2.21E-03 | 257.2 |
| K39 | Sn | 33.5 | 250 | 533 | 350 | 2.27E-03 | 268.2 |
| K40 | Sn | 32.4 | 250 | 503 | 350 | 2.36E-03 | 256.7 |
| K41 | Sn | 32.2 | 250 | 523 | 350 | 2.53E-03 | 267.0 |
| K43 | SiAl | 65.0 | 350 | 0 | 371 | 2.05E-03 | 291.5 |
| K46 | ZnAl | 43.5 | 250 | 545 | 0 | 1.49E-03 | 238.5 |
| K49-b | Ag | 9.5 | 150 | 0 | 0 | 1.32E-03 | 474.1 |
| K50 | NiCr | 17.5 | 250 | 150 | 0 | 1.32E-03 | 498.7 |
| K54 | Sn | 46.2 | 250 | 653 | 350 | 2.12E-03 | 311.0 |
| K59 | SiAl | 69.0 | 350 | 0 | 514 | 2.78E-03 | 293.7 |
| K60 | SiAl | 69.0 | 350 | 0 | 514 | 3.12E-03 | 336.0 |

After being sputter deposited onto the glass substrate, Example 1 had the following example characteristics after being subjected to HT along with another lite, spaced apart by powder, in a conventional furnace (HT in furnace with eight element heat zones (479, 520, 540, 590, 620, 655, 660, 665 degrees C. respectively, line speed of 28 cm/minute):

TABLE 9

Characteristics of Example 1 (Monolithic - HT)

| Characteristic | Example 1 |
|---|---|
| Visible Trans. (Y) (Ill. D65, 10 deg.): | 78.86% |
| a* | −1.35 |
| b* | −0.47 |
| L* | 91.17 |
| $ΔE^*_t$ | about 4-5 |
| Glass Side Refl. (RY) (Ill D65, 10 deg.): | 7.01% |
| a* | −2.39 |
| b* | 7.25 |
| L* | 31.83 |
| $ΔE^*_g$ | about 2-3 |

TABLE 9-continued

Characteristics of Example 1 (Monolithic - HT)

| Characteristic | Example 1 |
| --- | --- |
| Film Side Refl. (FY) (Ill. D65, 10 deg.): | 6.26% |
| a* | −10.43 |
| b* | 10.27 |
| L* | 30.07 |
| $R_s$ (ohms/square) (pre-HT): | about 2.5 to 3 |
| $R_s$ (ohms/square) (post-HT): | 2.30 |
| $T_{vis}/R_s$ (post-HT): | 34.29 |
| Transmissive Haze: | 0.20 |

The coated article of Example 1 was then laminated to another glass sheet (e.g., via PVB or index oil) to form a laminated windshield. The laminated windshield had the following characteristics. The laminate was as shown in FIG. 3, with the coating on the #3 surface (i.e., on the inner glass sheet). The "film side" measure measurements in Table 10 are as viewed from what would be the vehicle exterior, whereas the "glass side" measurements are as viewed from what would be the vehicle interior, since the coating is on the #3 surface of the laminate in this example.

TABLE 10

Characteristics of Example 1 (Laminated - HT)

| Characteristic | Example 1 |
| --- | --- |
| Lta (Tvis) (Ill. A, 2 deg.) | 76.06% |
| Visible Trans. (Y) (Ill. D65, 10 deg.): | 76.3% |
| a* | −2.59 |
| b* | 2.59 |
| L* | 90 |
| Glass Side Refl. (RY) (Ill D65, 10 deg.): | 8.65% |
| a* | −0.85 |
| b* | −7.96 |
| L* | 35.30 |
| Film Side Refl. (FY) (Ill. D65, 10 deg.): | 8.87% |
| a* | −2.19 |
| b* | −5.60 |
| L* | 35.72 |
| Transmissive Haze: | 0.33 |
| $R_{solar}$ (ISO 9050): | 30 |
| $T_{solar}$: | 42.5 |

In addition to the advantages set forth above, it has surprisingly and unexpectedly been found that coated articles according to certain example embodiments of this invention have improved heat treatability compared to other known coatings. For example, it has surprisingly been found that coated articles according to certain example embodiments of this invention can be exposed to about 650 degrees C. of heat treatment in a box furnace for 12 minutes without suffering a loss in visible transmission of more than 2% or delamination. In other words, when the coated article (typically in monolithic form) is exposed to about 650 degrees C. of heat treatment for 12 minutes, the coated article retains at least 98% of its pre-heat-treatment visible transmission. This temperature and time are used as a reference(s) herein, and are not intended to be limiting; these values being used to illustrate the improved heat treatability (or improved thermal stability) of certain example embodiments of this invention.

As an example of heat treatment, the coated article may be heat treated at the same time as another glass lite, with the two lites being spaced from one another in the furnace by a known powder material. During such heat treatment, the coated article may be located in the furnace so as to be spaced from another glass lite via a known powder such as Separol. Thus, it can be seen that thermal stability can be significantly improved according to certain example embodiments of this invention.

Certain terms are prevalently used in the glass coating art, particularly when defining the properties and solar management characteristics of coated glass. Such terms are used herein in accordance with their well known meaning (unless expressly stated to the contrary)—see parent Ser. No. 10/400,080, incorporated herein by reference. For example, the terms "heat treatment" and "heat treating" as used herein mean heating the article to a temperature sufficient to achieve thermal tempering, bending, and/or heat strengthening of the glass inclusive article. This definition includes, for example, heating a coated article in an oven or furnace at a temperature of least about 580 or 600 degrees C. for a sufficient period to allow tempering, bending, and/or heat strengthening, and also includes the aforesaid test for thermal stability at about 650 degrees C. In some instances, the HT may be for at least about 4 or 5 minutes, or more.

Haze is a scattering of energy, a percentage of energy lost as it scatters. Haze may be measured, for example, by a BYK Gardner transmission haze meter as will be appreciated by those skilled in the art.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims. For example, and without limitation, single silver stacks may be used in certain example embodiments of this invention, as opposed to the illustrated double silver stacks.

The invention claimed is:

1. A coated article including a multi-layer coating supported by a glass substrate, the multi-layer coating comprising, from the glass substrate outwardly:
a layer comprising silicon nitride located directly on and contacting the glass substrate;
a layer comprising zinc oxide located directly on and contacting the layer comprising silicon nitride;
a layer comprising silver located over and contacting the layer comprising zinc oxide;
a dielectric layer comprising a metal oxide;
another layer comprising silver;
another dielectric layer;
wherein the coated article is heat treated and has a ratio $T_{vis}/R_s$ of at least 25 after heat treatment (where $T_{vis}$ is visible transmission (%) and $R_s$ is sheet resistance of the coating in units of ohms/square) and a ΔE* value (glass side reflective and/or transmissive) of less than or equal to about 8 due to the heat treatment; and
wherein the layer comprising silicon nitride is Si-rich and has an index of refraction "n" of at least 2.10.

2. The coated article of claim 1, wherein the coated article has a ratio $T_{vis}/R_s$ of at least 30 after heat treatment.

3. The coated article of claim 1, wherein the coated article has a ratio $T_{vis}/R_s$ of at least 32 after heat treatment.

4. The coated article of claim 1, wherein the coated article has a ratio $T_{vis}/R_s$ of at least 34 after heat treatment.

5. The coated article of claim 1, wherein the layer comprising silicon nitride is Si-rich and has an index of refraction "n" of from 2.15 to 2.25.

6. The coated article of claim 1, wherein the coated article comprises a laminated vehicle windshield, and the layer comprising silicon nitride is partially oxided.

7. The coated article of claim 1, wherein the layer comprising silicon nitride has a thickness of from 100 to 200 Å.

8. The coated article of claim 1, wherein the coated article has a sheet resistance ($R_s$) of less than or equal to 4.0.

9. The coated article of claim 1, wherein the coated article is heat treated and has a $\Delta E^*$ value (glass side reflective and/or transmissive) of less than or equal to about 5 due to the heat treatment.

10. The coated article of claim 9, wherein the coated article has a $\Delta E^*$ value (glass side reflective and/or transmissive) of less than or equal to about 4 due to the heat treatment.

11. The coated article of claim 9, wherein the coated article has a $\Delta E^*$ value (glass side reflective and/or transmissive) of less than or equal to about 3 due to the heat treatment.

12. The coated article of claim 9, wherein the coated article has a $\Delta E^*$ value (glass side reflective and/or transmissive) of less than or equal to about 2.5 due to the heat treatment.

13. The coated article of claim 1, wherein said layer comprising silicon nitride is Si-rich and comprises $Si_xN_y$, where x/y is from 0.8 to 1.0.

14. The coated article of claim 1, wherein the coated article is a laminated vehicle windshield and is heat treated.

15. The coated article of claim 1, wherein at least one of the layer comprising silicon nitride and the layer comprising zinc oxide further includes aluminum or other metal(s).

16. The coated article according to claim 1, wherein the coated article comprises a laminated vehicle windshield and has a transmissive haze value of no greater than 0.4.

17. The coated article according to claim 1, wherein the coated article comprises a laminated vehicle windshield and has a transmissive haze value of no greater than 0.35, and a total solar (TS) value of no greater than 46.

18. The coated article according to claim 1, wherein the coated article is a laminated vehicle windshield and has a total solar (TS) value of no greater than 44.

19. The coated article of claim 1, characterized in that when the coated article is exposed to about 650 degrees C. of heat treatment for 12 minutes the coated article retains at least 98% of its pre-heat-treatment visible transmission.

20. A heat treated coated article including a multi-layer coating supported by a glass substrate, the multi-layer coating comprising, from the glass substrate outwardly:
   a layer comprising silicon nitride located directly on and contacting the glass substrate;
   a layer comprising zinc oxide;
   a layer comprising silver located over and contacting the layer comprising zinc oxide; and
   at least one dielectric layer; and
   wherein the coated article is heat treated and has a ratio $T_{vis}/R_s$ of at least 34 after heat treatment (where $T_{vis}$ is visible transmission (%) and $R_s$ is sheet resistance of the coating in units of ohms/square) and a $\Delta E^*$ value (glass side reflective and/or transmissive) of less than or equal to about 8 due to the heat treatment, and wherein the layer comprising silicon nitride is Si-rich and has an index of refraction "n" of at least 2.10.

21. The coated article of claim 20, wherein the layer comprising silicon nitride is Si-rich and has an index of refraction "n" of from 2.15 to 2.25.

22. The coated article of claim 20, wherein the coated article comprises a laminated vehicle windshield and has been heat treated.

23. The coated article of claim 20, wherein the layer comprising silicon nitride has a thickness of from 100 to 200 Å.

24. The coated article of claim 20, wherein the coated article has a sheet resistance ($R_s$) of less than or equal to 4.0.

25. The coated article of claim 20, wherein the coated article is heat treated and has a $\Delta E^*$ value (glass side reflective and/or transmissive) of less than or equal to about 5 due to the heat treatment.

26. The coated article of claim 20, wherein said layer comprising silicon nitride is Si-rich and comprises $Si_xN_y$, where x/y is from 0.8 to 1.0, and may optionally be partially oxided.

27. The coated article of claim 20, wherein at least one of the layer comprising silicon nitride and the layer comprising zinc oxide further includes aluminum or other metal(s).

28. The coated article according to claim 20, wherein the coated article comprises a laminated vehicle windshield and has a transmissive haze value of no greater than 0.35, and a total solar (TS) value of no greater than 46.

29. The coated article according to claim 20, wherein the coated article is a laminated vehicle windshield and has a total solar (TS) value of no greater than 44.

30. The coated article of claim 20, characterized in that when the coated article is exposed to about 650 degrees C. of heat treatment for 12 minutes the coated article retains at least 98% of its pre-heat-treatment visible transmission.

31. A heat treatable coated article including a multi-layer coating supported by a glass substrate, the multi-layer coating comprising, from the glass substrate outwardly:
   a layer comprising silicon nitride located directly on and contacting the glass substrate;
   a layer comprising at least one metal oxide;
   a layer comprising silver located over and contacting the layer comprising the at least one metal oxide;
   at least one dielectric layer;
   when the coated article is exposed to about 650 degrees C. of heat treatment for 12 minutes as a reference, the coated article retains at least 98% of its pre-heat-treatment visible transmission; and
   wherein the coated article has a ratio $T_{vis}/R_s$ of at least 32 after the heat treatment (where $T_{vis}$ is visible transmission (%) and $R_s$ is sheet resistance of the coating in units of ohms/square) and a $\Delta E^*$ value (glass side reflective and/or transmissive) of less than or equal to about 8 due to the heat treatment, and wherein the layer comprising silicon nitride is Si-rich and has an index of refraction "n" of from 2.15 to 2.25.

32. The coated article of claim 31, wherein the coated article is a laminated vehicle windshield or a monolithic window component.

33. A coated article including a multi-layer coating supported by a glass substrate, the multi-layer coating comprising, from the glass substrate outwardly:
   a layer comprising silicon nitride located directly on and contacting the glass substrate;
   a layer comprising zinc oxide located directly on and contacting the layer comprising silicon nitride;
   a layer comprising silver located over and contacting the layer comprising zinc oxide;
   a layer comprising at least one metal oxide;
   a dielectric layer comprising tin oxide;
   a dielectric layer comprising silicon nitride;
   a layer comprising zinc oxide;
   another layer comprising silver;
   another dielectric layer comprising metal oxide;
   another dielectric layer comprising silicon nitride; and
   wherein the coated article is heat treated and has a ratio $T_{vis}/R_s$ of at least 25 after heat treatment (where $T_{vis}$ is visible transmission (%) and $R_s$ is sheet resistance of the coating in units of ohms/square) and a $\Delta E^*$ value (glass side reflective and/or transmissive) of less than or equal to about 8 due to the heat treatment.

* * * * *